United States Patent
Kim et al.

(10) Patent No.: US 9,595,309 B2
(45) Date of Patent: Mar. 14, 2017

(54) SEMICONDUCTOR MEMORY DEVICE AND METHOD FOR OPERATING THE SAME

(71) Applicant: SK hynix Inc., Gyeonggi-do (KR)

(72) Inventors: Chang-Hyun Kim, Gyeonggi-do (KR); Min-Chang Kim, Gyeonggi-do (KR); Do-Yun Lee, Gyeonggi-do (KR); Jae-Jin Lee, Gyeonggi-do (KR); Hun-Sam Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/997,775

(22) Filed: Jan. 18, 2016

(65) Prior Publication Data

US 2017/0025162 A1      Jan. 26, 2017

(30) Foreign Application Priority Data

Jul. 22, 2015   (KR) .................. 10-2015-0103664

(51) Int. Cl.
| | |
|---|---|
| *G11C 8/00* | (2006.01) |
| *G11C 8/08* | (2006.01) |
| *G11C 8/12* | (2006.01) |
| *G11C 8/10* | (2006.01) |
| *G11C 11/4076* | (2006.01) |

(52) U.S. Cl.
CPC .................. *G11C 8/08* (2013.01); *G11C 8/00* (2013.01); *G11C 8/10* (2013.01); *G11C 8/12* (2013.01); *G11C 11/4076* (2013.01)

(58) Field of Classification Search
CPC .... G11C 8/12; G11C 8/10; G11C 8/00; G11C 18/14; G11C 7/1006; G11C 11/4076; G11C 11/85
USPC .................... 365/230.02, 189.09, 230.06
See application file for complete search history.

(56) References Cited

U.S. PATENT DOCUMENTS

| | | | | |
|---|---|---|---|---|
| 6,870,766 B2* | 3/2005 | Cho | ............ | G11C 7/04 365/185.03 |
| 6,954,394 B2* | 10/2005 | Knall | ............ | G11C 7/04 365/211 |
| 7,154,790 B2* | 12/2006 | Han | ............ | G11C 29/12 365/189.09 |
| 8,081,508 B2* | 12/2011 | Kim | ............ | G11C 5/143 365/185.03 |
| 9,001,579 B2* | 4/2015 | Song | ............ | G11C 7/04 365/185.03 |

FOREIGN PATENT DOCUMENTS

| | | |
|---|---|---|
| KR | 1020120086953 | 8/2012 |
| KR | 1020140146484 | 12/2014 |

* cited by examiner

*Primary Examiner* — Pho M Luu
(74) *Attorney, Agent, or Firm* — IP & T Group LLP (57) ABSTRACT

A semiconductor memory device includes a plurality of memory cells coupled to multiple word lines a word line deactivation voltage generation block suitable for generating word line deactivation voltages having different voltage levels corresponding to temperature ranges, and a word line driving block suitable for driving a word line to be deactivated with the word line deactivation voltages selected from the word line deactivation voltages.

14 Claims, 11 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2015-0103664, filed on Jul. 22, 2015, which is incorporated herein by reference in its entirety.

BACKGROUND

1. Field

Exemplary embodiments of the present invention relate to a semiconductor design technology and more particularly to a semiconductor memory device and a method of operation thereof.

2. Description of the Related Art

In general, a semiconductor memory device, such as a Double Data Rate Synchronous Dynamic Random Access Memory (DDR SDRAM) includes multiple memory banks having a large number of memory cells for storing data Each memory cell may typically include a cell capacitor and a cell transistor. Data are stored by charging or discharging the cell capacitors in the memory cells. The cell transistors function as gates that may permit reading or writing when they are open or simply storing data when they are closed. Ideally an electric charge stored in a cell capacitor should remain constant until it is changed by discharging it, however, in reality the stored charge may change overtime. For example, a charge stored in a cell capacitor may leak away or a discharged cell capacitor may inadvertently gain a charge. Since a charge in each cell capacitor represents one bit of data, a change in the charge may result in loss of data. In order to prevent stored data from being lost, semiconductor memory devices perform a background maintenance operation known as a refresh operation at regular time intervals. Refresh operations are widely known to those skilled in the art, and consist basically of reading and restoring the charge on each capacitor to its original level repeatedly in a consecutive cycle.

A refresh cycle depends upon the time that a charge can remain stored in a memory cell. Hence, if data can remain stored in a memory cell for a long time, it is possible then to reduce the frequency of refresh operations i.e. repeat refresh operations at longer time intervals. If data can be stored in a memory cell only for a short period of time then the refresh cycle should be shorter to prevent loss of data. A semiconductor memory device that can store data for a long period of time without a refresh operation is said to have a good refresh characteristic, while a semiconductor memory device keeping stored data for a short period of time without a refresh operation is said to have a bad refresh characteristic. Improving the refresh characteristic of a semiconductor device is generally desirable because it may also improve the operational efficiency of the semiconductor memory device as the frequency of refresh operations may be reduced.

Generally, there may be various ways to improve the refresh characteristic of semiconductor memory devices. For during the fabrication process of semiconductor memory devices, improvements may be obtained by better control of the making of the cell transistors and capacitors of the memory cells as well as the making of any peripheral circuits coupled to the memory cells. The refresh characteristic may also be improved by controlling the design and operation of each memory cell and the refresh operation related circuits. Fundamentally, since a refresh operation is needed because of electric charges leaking to or from a memory cell, reducing such leakage current should improve the refresh characteristic of a semiconductor memory device.

SUMMARY

Exemplary embodiments of the present invention are directed to a semiconductor memory device that may reduce a leakage current occurring in memory cells.

According to an embodiment of the present invention, a semiconductor memory device may include: a plurality of memory cells coupled to multiple word lines; an off voltage generation block suitable for generating word line deactivation voltages having different voltage levels corresponding to a plurality of temperatures; and a word line driving block suitable for driving a word line to be deactivated with a word line deactivation voltage selected from the word line deactivation voltages.

The semiconductor memory device may further include: a temperature detection block suitable for generating a plurality of detection signals corresponding to the plurality of temperatures and supplying the detection signals to the off voltage generation block.

The word line deactivation voltages may correspond to the plurality of the detection signals.

The semiconductor memory device may further include: an active voltage generation block suitable for generating an active voltage for activating a word line and supplying the active voltage to the word line driving block.

The voltage level of the word line deactivation voltage may get lower as a temperature gets higher.

The word line deactivation voltage generation block may include: a plurality of voltage generation units suitable, for generating a plurality of internal voltages; and a multiplexing unit suitable for outputting one of the internal voltages as the word line deactivation voltage in response to the detection signal.

The word line deactivation voltage generation block may further include: a voltage generation unit suitable for generating the word line deactivation voltages; and a trimming unit suitable for controlling the word line deactivation voltages to the predetermined voltage during a training operation.

The semiconductor memory device may further include: a training control block suitable for controlling the trimming unit during the training operation, and controlling the trimming unit in response to the detection signal during a normal operation.

The training control block may include: a first control signal generation unit suitable for generating a control signal for controlling the voltage level of the word line deactivation voltage during the training operation; a second control signal generation unit suitable for generating a control signal for controlling the voltage level of the word line deactivation voltage to have a voltage level corresponding to the detection signal during the normal operation; and a multiplexing unit suitable for outputting one of the first and second control signal generation units through the training operation and the normal operation.

The second control signal generation unit may receive information corresponding to the control signal of the first control signal generation unit after the training operation is completed.

The word line driving block may include: a driving unit suitable for driving a selected word line; and a voltage set unit suitable for supplying the word line deactivation voltage or a predetermined voltage to the driving unit in response to state information of a memory cell coupled to the corresponding word line.

According to an embodiment of the present invention, a semiconductor memory device may include: a plurality of memory cells coupled to multiple word lines; a plurality of temperature detection blocks corresponding to temperature ranges that are set based on state information of the memory cells; a plurality of word line deactivation voltage generation blocks suitable for generating word line deactivation voltages having different voltage levels corresponding to output signals of the temperature detection blocks; and a plurality of word line driving blocks suitable for driving a word line to be deactivated with the word line deactivation voltage selected from the word line deactivation voltages.

The semiconductor memory device may further include: an active voltage generation block suitable for generating an active voltage for activating the word lines and supplying the active voltage to the word line driving blocks.

The voltage, level, of the word line deactivation voltage may get lower as a temperature gets higher.

The word line deactivation voltage may have a first voltage level when a operation state or a process state of the memory cells is good, and the word line deactivation voltage may have a second voltage level which is lower than the first voltage level when the operation state or the process state of the memory cells is bad.

Some of the word lines may have the word line deactivation voltage having the first voltage level, and the other word lines may have the word line deactivation voltage having the second voltage level.

According to an embodiment of the present invention, a method for operating a semiconductor memory device, the method may include: detecting a temperature; generating word line deactivation voltages having different voltage levels based on the detected temperature; and driving a word line to be deactivated with the word line deactivation voltage selected from the word line deactivation voltages.

The word line deactivation voltages may include a ground voltage and a negative voltage.

DETAILED DESCRIPTION

Exemplary embodiments of the present invention; are described with reference to the accompanying drawings. These embodiments are provided so that this disclosure is thorough and complete. However, it should be understood, that the described embodiments are not intended to limit the scope of the invention. Hence, many other embodiments of the invention may be envisioned by the skilled persons in this art after having read the present disclosure without departing from the scope of the invention.

The terminology used herein is for the purpose of describing particular embodiments only and is not intended to be limiting of the inventive concept. As used herein, the singular forms "a", "an" and the are intended to include the plural forms as well, unless the context clearly indicates otherwise. It will be further understood that the terms "comprises" and/or "comprising," when used in this specification, indicate the presence of stated features, but do not preclude the presence or addition of one or more other features. As used herein, the term "and/or" indicates any and all combinations of one or more of the associated listed items.

Figure 1:
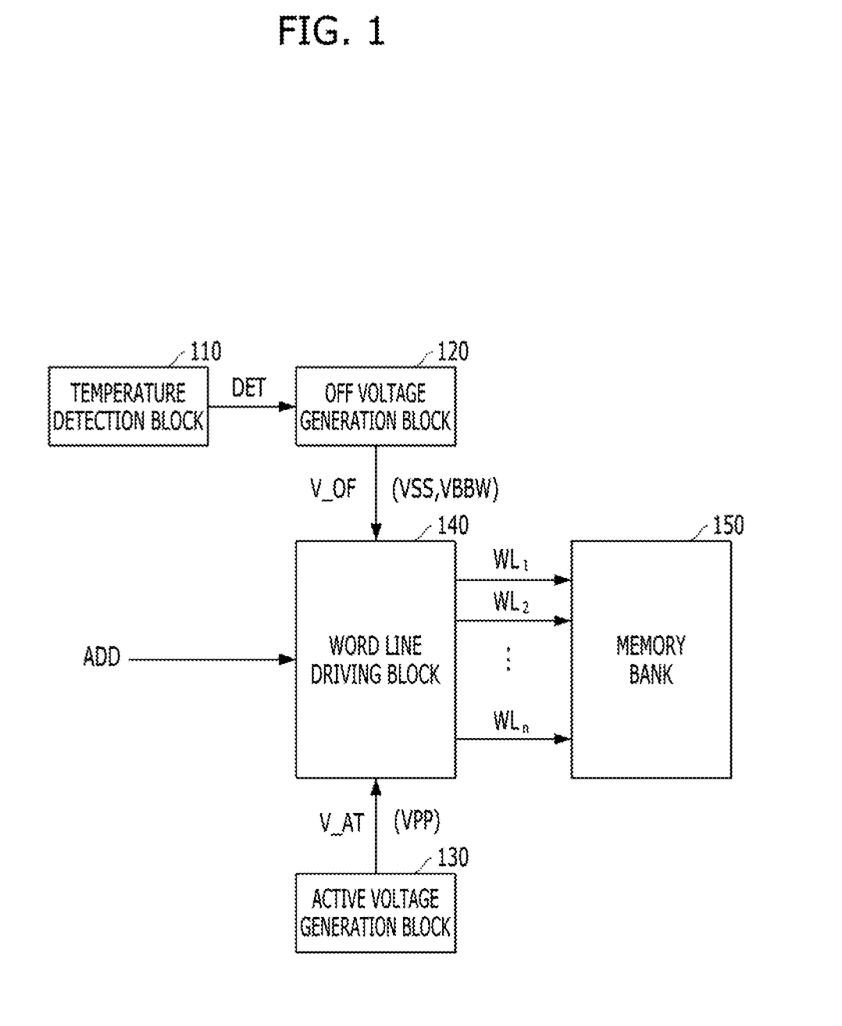
FIG. 1 is a block diagram illustrating a semiconductor memory device, according to an embodiment of the present invention.

Referring now to FIG. 1, a semiconductor memory device is provided, according to an embodiment of the invention. The semiconductor memory device may include a temperature detection block 110, an off voltage generation block 120, an active voltage generation block 130, a word line driving block 140, and a memory bank 150.

The temperature detection block 110 may detect a temperature of the semiconductor memory device. For example, the temperature detection block 110 may detect a temperature of the memory bank 150. The temperature detection block 110 may generate a detection signal DET based on the detected temperature. The detection signal DET may have a "low" logic level or a "high" logic level when a detected temperature is equal to or greater than a predetermined temperature.

The off voltage generation block 120 may generate an off voltage V_OF for deactivating word lines. The off voltage V_OF may be a word line deactivation voltage. The off voltage V_OF may be a precharge voltage. The off voltage generation block 120 may generate a ground voltage VSS or a back bias voltage VBBW as the off voltage V_OF in response to the detection signal DET. The back bias voltage VBBW may be generated by pumping the ground voltage VSS. The back bias voltage VBBW may be lower than the ground voltage VSS. For example, the back bias voltage VBBW has a negative voltage level.

The active voltage generation block 130 may generate an active voltage V_AT for activating the word lines. The active voltage generation block 130 may generate a pumping voltage VPP as the active voltage V_AT The pumping voltage VPP may be generated by pumping a power supply voltage VDD (not shown) and may have a higher voltage level than the power supply voltage VDD.

The word line driving block 140 may drive a plurality of word lines WL1, WL2, ..., and WLn (where n is a natural number) by decoding an address signal ADD. The word line driving block 140 may perform an active operation on a word line corresponding to the address signal ADD among the word lines WL1, WL2, ..., and WLn and a deactivation (or precharge) operation on the other word lines. The word line driving block 140 may receive the off voltage V_OF from the off voltage generation block 120 and the active voltage V_AT from the active voltage generation block 130. The word line driving block 140 may drive a word line to be activated with the active voltage V_AT. The word line driving block 140 may drive a word line to be deactivated with the off voltage V_OF.

The memory bank 150 may include a plurality of memory cells coupled to each of the word lines WL1, WL2, ..., and WLn. The pumping voltage VPP may be applied to one or more of the word lines that are activated. A read operation, a write operation and a refresh operation may be performed on one or more memory cells coupled to an activated word line. The off voltage V_OF may be applied to any remaining non-activated word lines.

Hereinafter, a simple circuit operation is described, first for a semiconductor memory device operating at a high temperature and then for a semiconductor memory device operating at a low temperature. Accordingly, for the case where the semiconductor memory device operates at a high temperature, the temperature detection block 110 may detect a high temperature and generate the detection signal DET having a high logic level. The off-voltage generation block 120 may output the back bias voltage VBBW as the off voltage V_OF in response to the detection signal DET. The word line driving block 140 may receive the back bias voltage VBBW as the off voltage V_OF and the pumping voltage VPP as the active voltage V_AT. Subsequently, the word line driving block 140 may apply the pumping voltage VPP which is the active voltage V_AT to at least one word line of the word lines WL1 to WLn corresponding to the address signal ADD, and the back bias voltage VBBW which is the off voltage V_OF to the remaining word lines. Hence, when the semiconductor memory device operates at a high temperature, a back bias voltage VBBW may be applied to the word lines to be deactivated.

When the semiconductor memory device operates at a low temperature, the temperature detection block 110 may detect a low temperature and generate the detection signal DET having a low logic level. The off-voltage generation block 120 may output the ground voltage VSS as the off voltage V_OF in response to the detection signal DET. The word line driving block 140 may apply the ground voltage VSS which is the off voltage V_OF to the other word lines except for the word line or lines to be activated. Consequently, when the semiconductor memory device operates at a low temperature, a ground voltage VSS may be applied to the word lines to be deactivated.

According to an embodiment, the semiconductor memory device may generate a back bias voltage VBBW as the off voltage V_OF at the high temperature and a ground voltage VSS as the off voltage V_OF at a low temperature. In other words, the semiconductor memory device may control the off voltage V_OF based on the detected temperature.

Figure 2:
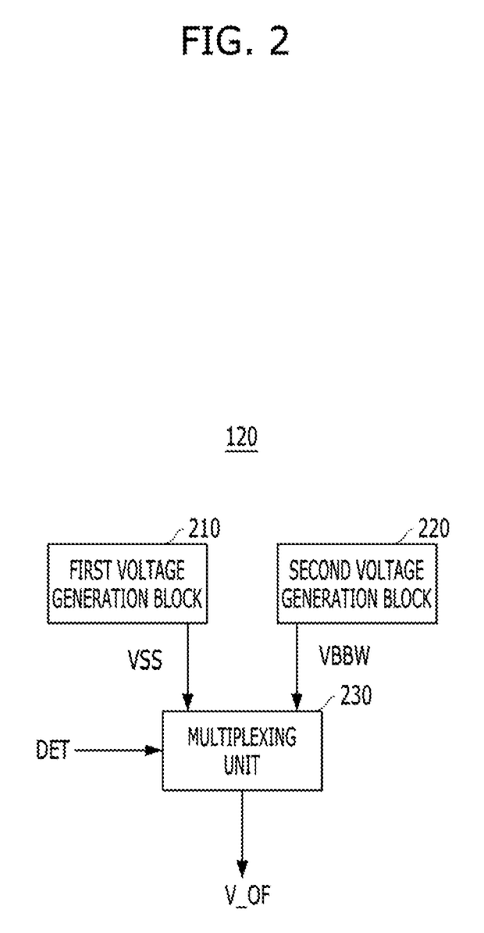
FIG. 2 is a block diagram of an off voltage generation block of a semiconductor memory device as shown in FIG. 1, according to an embodiment of the present invention.

FIG. 2 is a detailed diagram of an example of an off voltage generation block 120 employed in a semiconductor device as shown in FIG. 1.

Referring now to FIG. 2, the off-voltage generation block 120 may include a first voltage generation unit 210, a second voltage generation unit 220, and a multiplexing unit 230.

The first voltage generation unit 210 may generate a ground voltage VSS, and the second voltage generation unit 220 may generate a back bias voltage VBBW. The multiplexing unit 230 may selectively output the ground voltage VSS or the back bias voltage VBBW in response to the detection signal DET.

In other words, the off-voltage generation block 120 may generate the ground voltage and the back bias voltage VBBW, which become a source of the off voltage V_OF, and may output the ground voltage or the back bias voltage VBBW as the off voltage V_OF in response to detection signal DET that is generated based on a detected temperature.

While, with reference to FIGS. 1 and 2, two examples wherein the semiconductor memory device operates at high and at a low temperature are described, it should be noted that the semiconductor device may also operate at a plurality of temperatures as will be described in more detail below with reference to FIG. 3.

Figure 3:
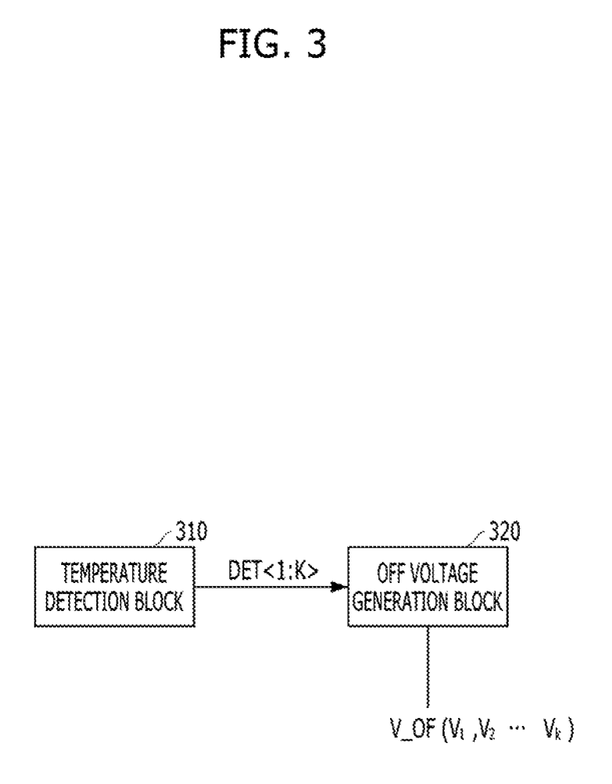
FIG. 3 is a diagram illustrating a temperature detection block and an off voltage generation block of a semiconductor memory device, according to an embodiment of the present invention.

For avoiding unnecessary repetition, FIG. 3 only shows a portion of a semiconductor memory device, according to another embodiment of the invention.

The semiconductor memory device may include a temperature detection block 310 and an off voltage generation block 320. The temperature detection block 310 may generate a plurality of detection signals DET<1:k> (where k is a natural number equal to or greater than 2) corresponding to a plurality of temperatures of the semiconductor memory device.

The off voltage generation block 320 may generate a plurality of voltages V1, V2, ..., and Vk corresponding to the plurality of detection signals DET<1:k>, as an off voltage V_OF. Each of the plurality of voltages V1 to Vk may have a voltage level corresponding to a temperature level. For instance, where three detection signals are generated corresponding to a low, medium and high temperature, then three voltages V1, V2 and V3 may be generated having a low, medium and high voltage level. The numbers of the detection signals DET<1:k> and the voltages V1, V2, ..., and Vk that may be generated as the off voltage V_OF may vary according to design.

According to an embodiment, the semiconductor memory device may generate the voltages V1, V2, ..., and Vk having a voltage level corresponding to a plurality of temperatures from various segments of the semiconductor device as the off voltage V_OF.

Figure 4:
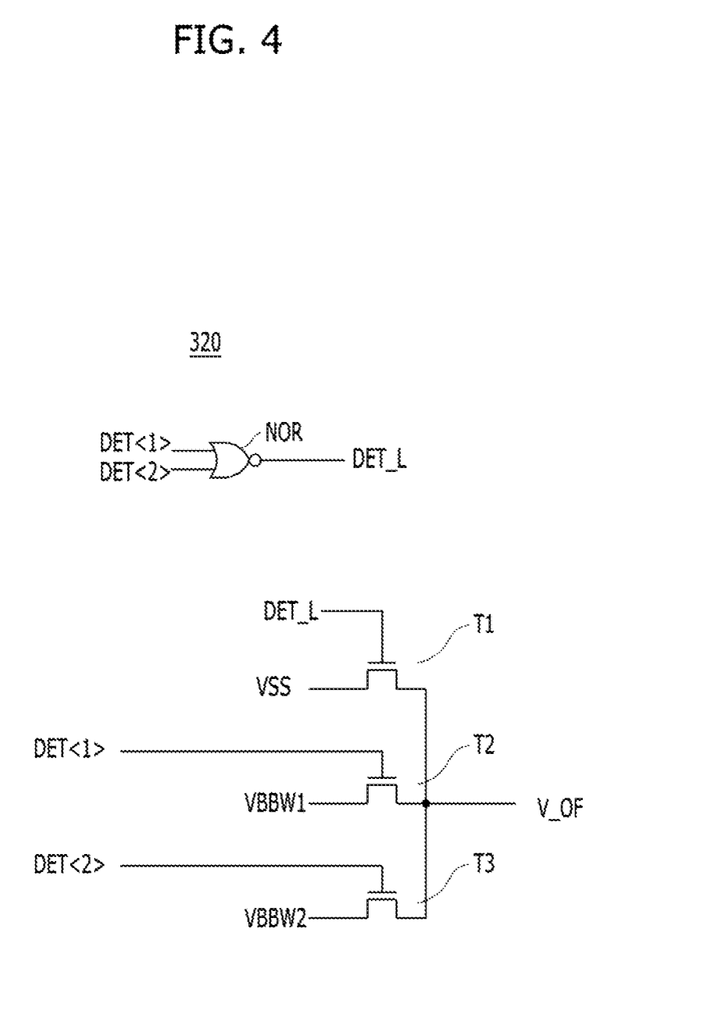
FIG. 4 is a circuit diagram illustrating an off voltage generation block shown in FIG. 3, according to an embodiment of the present invention.

FIG. 4 is a circuit diagram illustrating an example of an off voltage generation block 320 wherein two detection signals DET<1:2> are generated, a first detection signal DET<1> and a second detection signal DET<2>.

As shown in FIG. 4, the off voltage generation block 320 may include a NOR gate NOR, a first transistor T1, a second transistor T2, and a third transistor T3. The NOR gate NOR may generate a low temperature detection signal DET_L in response to the first detection signal DET<1> and the second detection signal DET<2>. The first transistor T1 may output a ground voltage VSS as the off voltage V_OF in response to the low temperature detection signal DET_L. The second transistor T2 may output a first back bias voltage VBBW1 as the off voltage V_OF in response to the first detection signal DET<1>. The third transistor T3 may output a second back bias voltage VBBW2 as the off voltage V_OF in response to the second detection signal DET<2>. The transistors may be NMOS transistors. Other types of transistors may also be employed. The back bias voltages VBBW1 and VBBW2 may have negative voltage levels.

Figure 5:
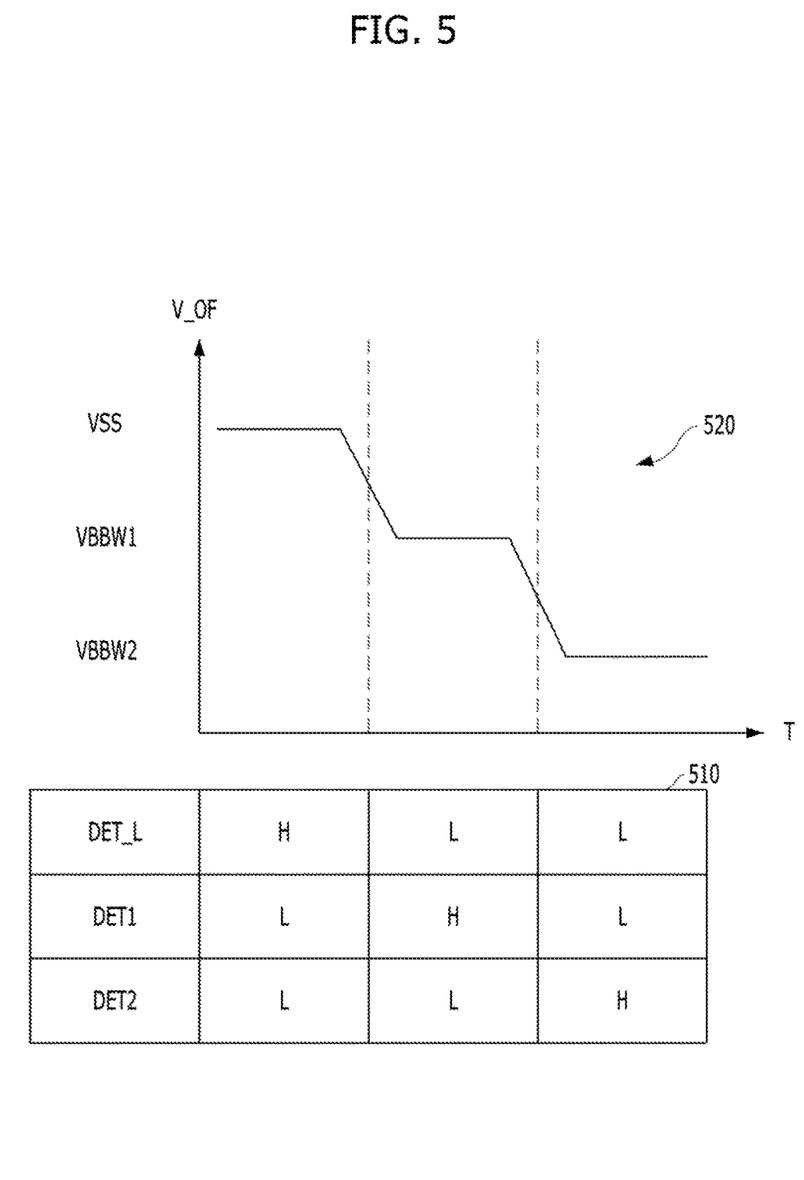
FIG. 5 is a diagram illustrating a relationship between first and second detection signals and an off voltage as shown in FIG. 4, according to an embodiment of the present invention.

FIG. 5 is a diagram illustrating a relationship between the first and second detection signals DET<1:2> and the off voltage V_OF shown in FIG. 4. In the example shown, it is assumed that the ground voltage VSS has a higher voltage level than the first back as voltage VBBW1 and the second back bias voltage VBBW2 has a lower voltage level than the first back bias voltage VBBW1. More specifically, FIG. 5 provides a Table 510 showing logic levels of the low temperature detection signal DET_L and the first and second detection signals DEL<1:2> and a graph 520 showing a voltage level of the off voltage V_OF outputted based on temperatures.

Referring to the Table 510, when the temperature is relatively low, the first and second detection signals DET<1:2> may have a low logic level, and the low temperature detection signal DET_L may have a high logic level based on the NOR gate NOR shown in FIG. 4. Referring to the graph 520, the first transistor T1 shown in FIG. 4 may be turned on in response to the low temperature detection signal DET_L having the high logic level, and subsequently, the ground voltage VSS may be outputted as the off voltage V_OF.

When the temperature is intermediate, the first detection signal DET<1> may have a high logic level. Therefore the second transistor T2 shown in FIG. 4 may be turned on and then, the first back bias voltage VBBW1 may be outputted as the off voltage V_OF.

When the temperature is high, the second detection signal DET<2> may have a high logic level. Therefore, the third transistor T3 shown in FIG. 4 may be turned on, and the second back bias voltage VBBW2 may be outputted as the off voltage V_OF.

According to an embodiment, the semiconductor memory device may control the voltage level of the off voltage V_OF based on temperatures, and particularly, as the temperature gets higher, the voltage level of the off voltage V_OF may be reduced.

As shown in FIG. 2, the semiconductor memory device may include first and second voltage generation units 210, 220 for generating the off voltage V_OF. Likewise, applying this technique to the off voltage generation block 320 shown in FIG. 3, the off voltage generation block 320 may be formed of k voltage generation units.

Hereinafter, it is described as an example that the off voltage V_OF having different voltage levels is generated in a single voltage generation unit. It is assumed, that the off voltage V_OF is generated to have one or more voltage levels corresponding to one or more detected temperatures. The off voltage V_OF may not include a ground voltage VSS.

Figure 6:
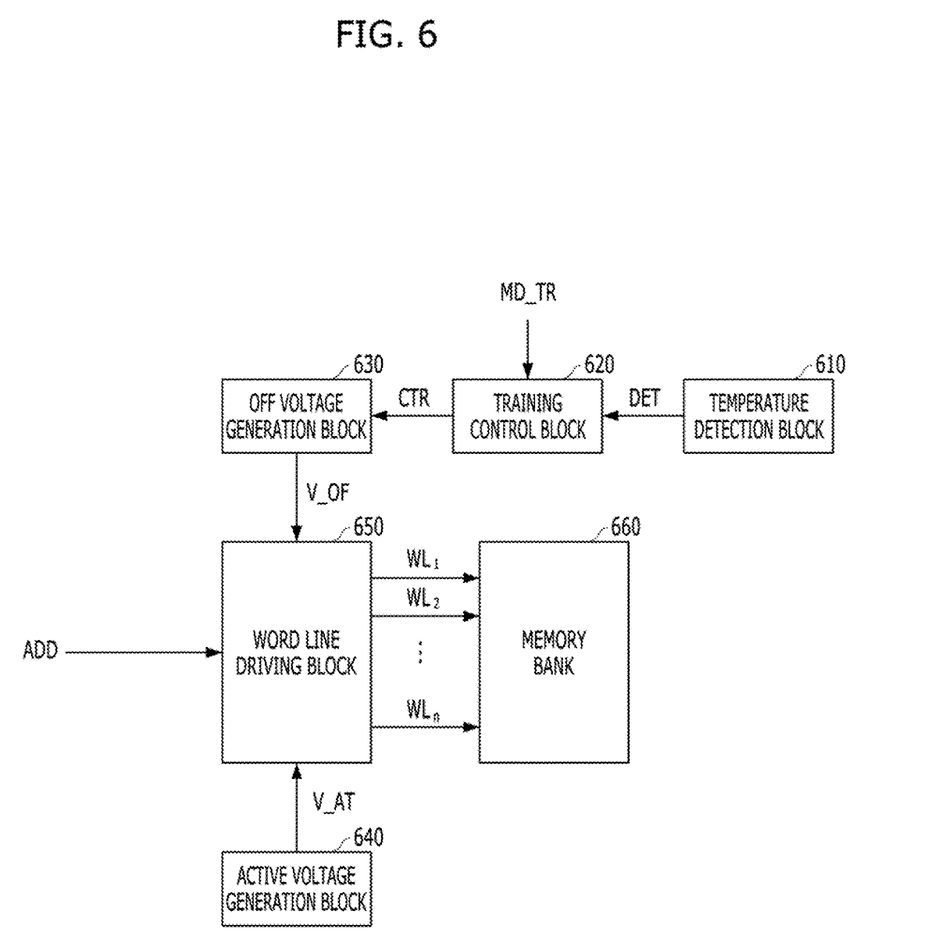
FIG. 6 is a block diagram illustrating a semiconductor memory device, according to an embodiment of the present invention.

Referring now to FIG. 6, a semiconductor memory device, according to another embodiment of the invention, may include a temperature detection block 610, a training control block 620, an off voltage generation block 630 an active voltage generation block 640, a word line driving block 650, and a memory bank 660.

The temperature detection block 610 may detect a temperature of the semiconductor memory device to generate a detection signal DET.

The training control block 620 may generate a control signal CTR for controlling an off voltage (i.e., a word line deactivation voltage or a precharge voltage) V_OF to a predetermined voltage level in response to a training mode signal MD_TR that may be enabled during a training operation. Further, the training control block 620 may generate the control signal CTR for controlling the off voltage V_OF to have a voltage level corresponding to a temperature in response to the detection signal DET during a normal operation.

The off voltage generation block 630 may generate the off voltage V_OF for deactivating word lines. The off voltage generation block 630 may generate the off voltage V_OF having a voltage level corresponding to the control signal CTR in response to the control signal CTR that may be generated during the training operation and the normal operation.

The active voltage generation block 640 may generate an active voltage V_AT for activating the word lines.

The word line driving block 650 may drive a plurality of word lines WL1, WL2, . . . , and WLn (where n is a natural number) by decoding an address signal ADD. The word line driving block 650 may perform an active operation on one or more word lines corresponding to the address signal ADD among the word lines WL1, WL2, . . . , and WLn and a deactivation operation on the remaining word lines. The word line driving block 650 may receive the of voltage V_OF from the off voltage generation block 630 and the active voltage V_AT from the active voltage generation block 640. The word line driving block 650 may drive the word line to be activated with the active voltage V_AT and the word lines to be deactivated with the off voltage V_OF.

The memory bank 660 may include a plurality of memory cells coupled to each of the word lines WL1, WL2, . . . , and WLn. A pumping voltage VPP which is an active voltage may be applied to a word line activated among the word lines WL1, WL2, . . . , and WLn. A read operation, a write operation and a refresh operation may be performed on the memory cells coupled to an activated word line where the pumping voltage VPP is applied.

According to an embodiment, the semiconductor memory device may control the off voltage V_OF to a predetermined voltage level through the training operation. Further, the semiconductor memory device may control the off voltage V_OF to have a voltage level corresponding to a temperature during the normal operation based on a circuit used for the training operation. A more detailed description thereof will be provided below with reference to FIGS. 7 and 8.

Figure 7:
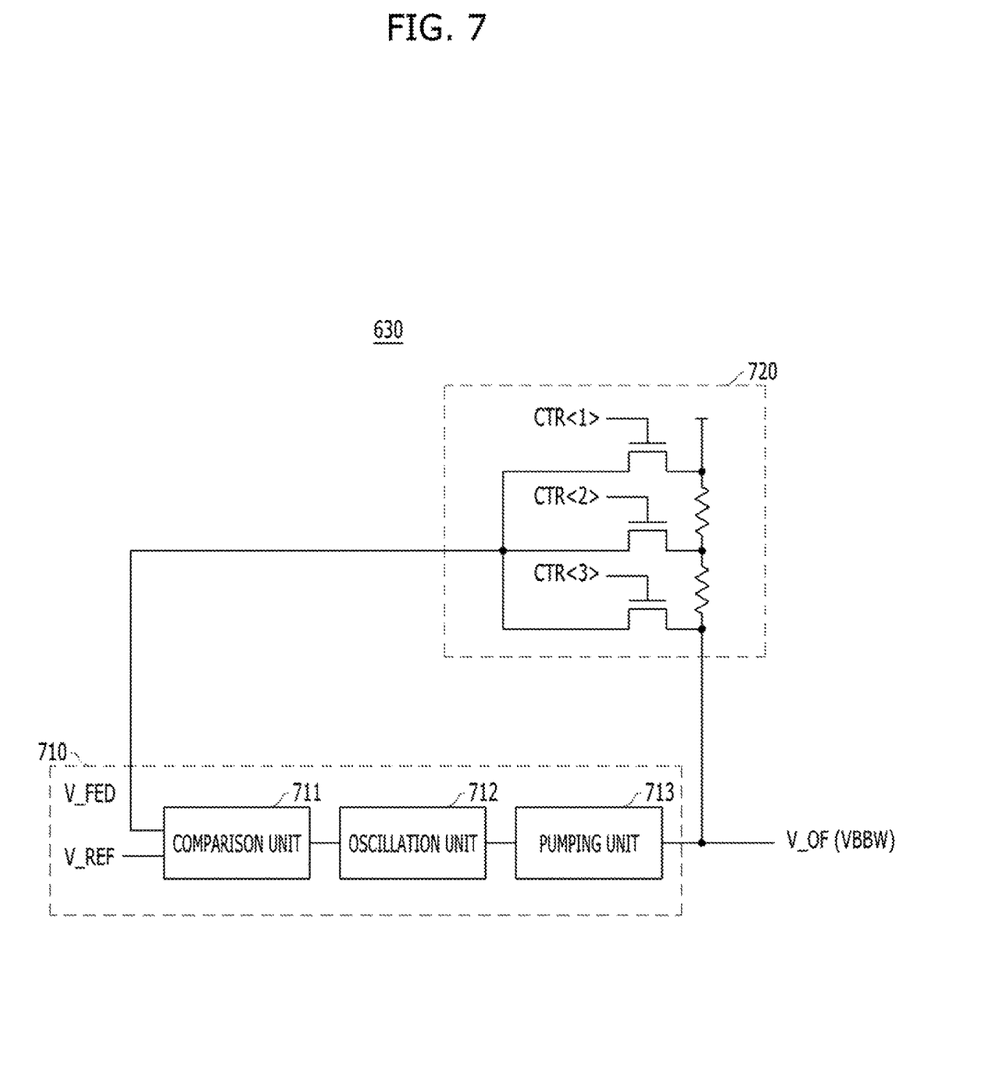
FIG. 7 is a detailed diagram illustrating an off voltage generation block as shown in FIG. 6, according to an embodiment of the present invention.

Specifically, FIG. 7 is a diagram of an off voltage generation block 630 as shown in FIG. 6. The off voltage generation block 630 may include all needed circuits for generating an internal voltage used for the semiconductor memory device. For example, the circuits for generating the internal voltage may include a circuit for generating the internal voltage based on a differential amplification circuit and a circuit for generating the internal voltage based on a pumping circuit. FIG. 7 shows that the off voltage generation block 630 employs a pumping circuit. A back bias voltage VBBW is generated through a pumping operation.

Referring now to FIG. 7, the off voltage generation block 630 may include a pumping voltage generation part 710 and a trimming part 720.

The pumping voltage generation part 710 may generate the back bias voltage VBBW corresponding to a reference voltage V_REF through a pumping operation. The pumping voltage generation part 710 may include a comparison unit 711, an oscillation unit 712, and a pumping unit 713. The comparison unit 711 may compare the reference voltage V_REF with a feedback voltage V_FED The oscillation unit 712 may perform an oscillation operation in response to an output signal of the comparison unit 711. The pumping unit 713 may perform the pumping operation to generate the back bias voltage VBBW, for example, in response to an oscillation signal generated from the oscillation unit 712.

The trimming part 720 may control a voltage level of the back bias voltage VBBW and output the controlled back has voltage VBBW as the feedback voltage V_FED in response to first to third control signals CTR<1:3>. Herein, although the trimming part 720 is formed of three MOS transistors that operate in response to the first to third control signals CTR<1:3>, the invention is not limited in such a way and various other embodiments may be envisioned. The first to third control signals CTR<1:3> may be generated during a training operation and/or a normal operation as will be described with reference to FIG. 8.

Figure 8:
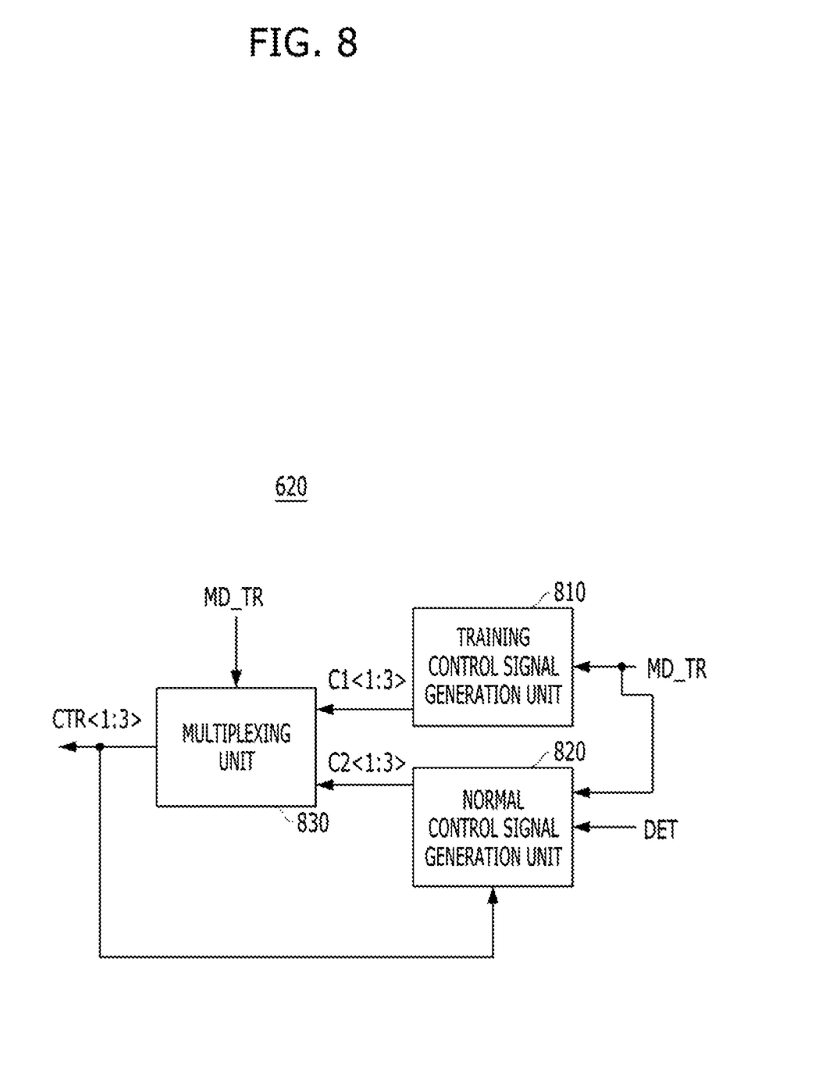
FIG. 8 is a block diagram of a training control block as shown in FIG. 6, according to an embodiment of the present invention.

FIG. 8 is a detailed diagram of example of a training control block 620 as shown in FIG. 6.

Referring to FIG. 8, the training control block 620 may include a training control signal generation unit 810, a normal control signal generation unit 820, and a multiplexing unit 830.

The training control signal generation unit 810 may generate control signals C1<1:3> for controlling the back bias voltage VBBW to a predetermined voltage level during the training operation in response to the training mode signal MD_TR. The normal control signal generation unit 820 may generate control signals C2<1:3> for controlling the back bias voltage VBBW to have a voltage level corresponding to the detection signal DET during normal operation. The multiplexing unit 830 may selectively output the control signals C1<1:3> of the training control signal generation unit 810 or the control signals C2<1:3> of the normal control signal generation unit 820 as first to third control signals CTR<1:3> in response to the training mode signal MD_TR.

The normal control signal generation unit 820 may obtain information corresponding to the first to third control signals CTR<1:3> when the training operation is completed and perform the normal operation based on the obtained information.

Referring to FIGS. 7 and 8, during training operation, the training control signal generation unit 810 (shown in FIG. 8) may generate the control signals C1<1:3> for the training operation, and the multiplexing unit 830 may output the control signals C1<1:3> as the first to third control signals CTR<1:3>. The trimming part 720 (shown in FIG. 7) may trim the back bias voltage VBBW to have a predetermined voltage level in response to the first to third control signals CTR<1:3>. The semiconductor memory device may complete the training operation when the back bias voltage VBBW has the predetermined voltage level through the training operation. In the described example, it is assumed that the second control signal CTR<2> is enabled through the training operation.

During the normal operation, the semiconductor memory device may use the back bias voltage VBBW having the predetermined voltage level as the off voltage V_OF during the training operation. When the temperature changes, the normal control signal generation unit 820 shown in FIG. 8 may generate the control signals C2<1:3> in response to the detection signal DET, and the multiplexing unit 830 may output the control signals C2<1:3> as the first to third control signals CTR<1:3>. The normal control signal generation unit 820 may obtain information corresponding to the first to third control signals CTR<1:3> when the training operation is completed. Herein, the information indicates that the second control signal CTR<2> is enabled. When the temperature is high or low based on the detection signal DET, the control signals C2<1:3> may be generated so that the first control signal CTR<1> or the third control signal CTR<3> may be enabled. Subsequently, the trimming part 720 shown in FIG. 7 may generate the feedback voltage V_FED by controlling the voltage level of the back bias voltage VBBW based on the first to third control signals CTR<1:3>. As a result, voltage level of the feedback voltage V_FED may change based on the detection signal DET. Controlling the voltage level of the feedback voltage V_FED may allow controlling the voltage level of the back bias voltage VBBW set during the training operation based on one or more detected temperatures.

According to an embodiment, the semiconductor memory device may control the voltage level of the off voltage V_OF based on temperatures by using trimming circuits used for the training operation.

Figure 9:
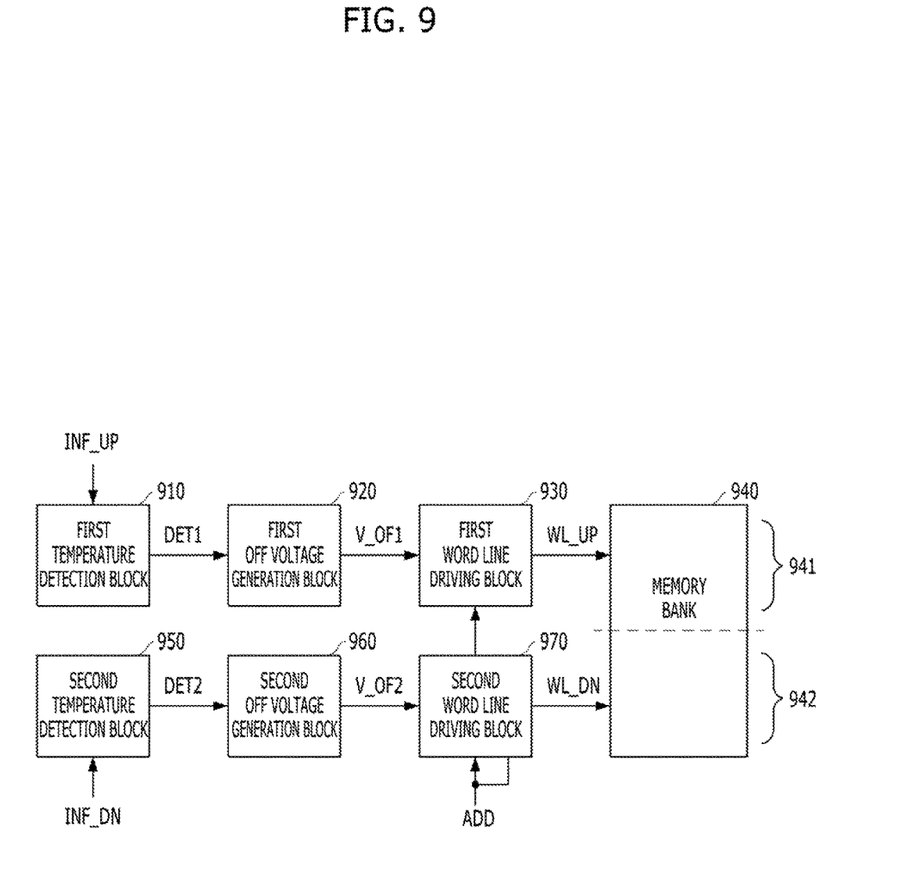
FIG. 9 is a block diagram illustrating a semiconductor memory device, according to an embodiment of the present invention.

Referring to FIG. 9, another example of a semiconductor memory device is provided. The semiconductor memory device may include a first temperature detection block 910, a first off voltage generation block 920, a first word line driving block 930, a memory bank 940, a second temperature detection block 950, a second off voltage generation block 960, and a second word line driving block 970. For avoiding unnecessary repetition, the structure in which an active voltage is applied to the first and second word line driving block 930 and 970 during an active operation is omitted herein.

The first temperature detection block 910 may set a detection temperature based on up state information INF_UP of an upper memory region 941 of the memory bank 940 and may determine a logic level of a first detection signal DET1 based on the set detection temperature. The up state information INF_UP may indicate the information corresponding to an operation state or a process state of a memory cell arranged in the upper memory region 941, and the detection temperature may indicate the temperature that the first temperature detection block 910 is supposed to detect. For example, when the operation state or the process state of the upper memory region 941 is good, it may be possible to set the detection temperature high. When the operation state or the process state of the upper memory region 941 is bad, it may be possible to set the detection temperature low. A description of operations performed when the detection temperature is set high or low will be described again below.

Accordingly, the first off voltage generation block 920 may generate a first off voltage V_OF1 in response to the first detection signal DET1 outputted from the first temperature detection block 910. The first off voltage V_OF1 may have a voltage level corresponding to the first detection signal DET1, similarly to the off voltage V_OF described with reference to FIGS. 1 to 8.

The first word line driving block 930 may drive a word line where a deactivation operation is performed among a plurality of up word lines WL_UP arranged in the upper memory region 941 with the first off voltage V_OF1. The first word line driving block 930 may perform an active operation on a word line corresponding to an address signal ADD among the up word lines WL_UP.

The memory bank 940 may be divided into an upper memory region 941 and a lower memory region 942. The upper memory region 941 may include a plurality of memory cells coupled to each of the up word lines WL_UP, and the lower memory region 942 may include a plurality of memory cells coupled to each of down word lines WL_DN.

The second temperature detection block 950 may set a detection temperature based on down state information INF_DN of the lower memory region 942 and determine a logic level of a second detection signal DET2 based on the set detection temperature. The down state information INF_DN may indicate the information corresponding to an operation state or a process state of a memory cell arranged in the lower memory region 942, and the detection temperature may indicate the temperature that the second temperature detection block 950 is supposed to detect.

The second off voltage generation block 960 may generate a second off voltage V_OF2 in response to the second detection signal DET2 outputted from the second temperature detection block 920. The second off voltage V_OF2 may have a voltage level corresponding to the second detection signal DET2, similarly to the first off voltage V_OF1.

The second word line driving block 970 may drive a word line where the deactivation operation is performed among the down word lines WL_DN arranged in the lower memory region 942 with the second off voltage V_OF2. The second word line driving block 970 may perform the active operation on a word line corresponding to the address signal ADD among the down word lines WL_DN.

Hereinafter, a simple circuit operation is described. It is assumed that each of the first off voltage V_OF1 and the second off voltage V_OF2 may have two voltage levels of a ground voltage VSS and a back bias voltage VBBW. Further, it is assumed that an operation state or a process state of the upper memory region 941 is better than that of the lower memory region 942.

The first temperature detection block 910 may obtain information that the operation state or the process sate of the upper memory region 941 is good based on the up state information INF_UP and set the detection temperature, e.g., from approximately 80° C. to approximately 90° C., higher. The second temperature detection block 950 may set the detection temperature, e.g., from approximately 80° C. to approximately 70° C., lower based on the down state information INF_DN.

While the detection temperatures of the first and second temperature detection blocks 910 and 950 are set like the above, the first off voltage generation block 920 may generate the ground voltage VSS as the first off voltage V_OF1, and the second off voltage generation block 960 may generate the ground voltage VSS as the second off voltage V_OF2 when the temperature of the semiconductor memory device is equal to or less than approximately 70° C. When the temperature of the semiconductor memory device ranges from approximately 70° C. to approximately 90° C., the first off voltage V_OF1 may be the ground voltage VSS, and the second off voltage V_OF2 may be the back bias voltage VBBW. When the temperature of the semiconductor memory device is equal to or greater than approximately 90° C., the first off voltage V_OF1 and the second off voltage V_OF2 may be the back bias voltage VBBW.

Consequently, the word lines of the memory region where the operation state or the process state is good may be driven with the ground voltage VSS and the back bias voltage VBBW on a basis of approximately 90° C. during the deactivation operation, and the word lines of the memory region where the operation state or the process state is bad may be driven with the ground voltage VSS and the back bias voltage VBBW on a basis of approximately 70° C. during the deactivation operation.

According to an embodiment of the present invention, the semiconductor memory device may set the detection temperature based on state information of each of the memory cells and control the voltage level of the off voltage based on the detected result based on the set detection temperature.

Particularly, in the semiconductor memory device shown in FIG. 9, the first off voltage V_OF1 that is driven to the up word lines WL_UP of the upper memory region 941 and the second off voltage V_OF2 that is driven to the down word lines WL_DN of the lower memory region 942 may have different voltage levels from each other.

Although FIG. 9 shows that the memory bank 940 is divided into the upper memory region 941 and the lower memory region 942, the memory bank 940 may be further divided into several memory regions according to design. Further, although it is described as an example that a plurality of off voltages are applied to a single memory bank in FIG. 9, different off voltages may be applied to each of multiple memory banks.

Figure 10:
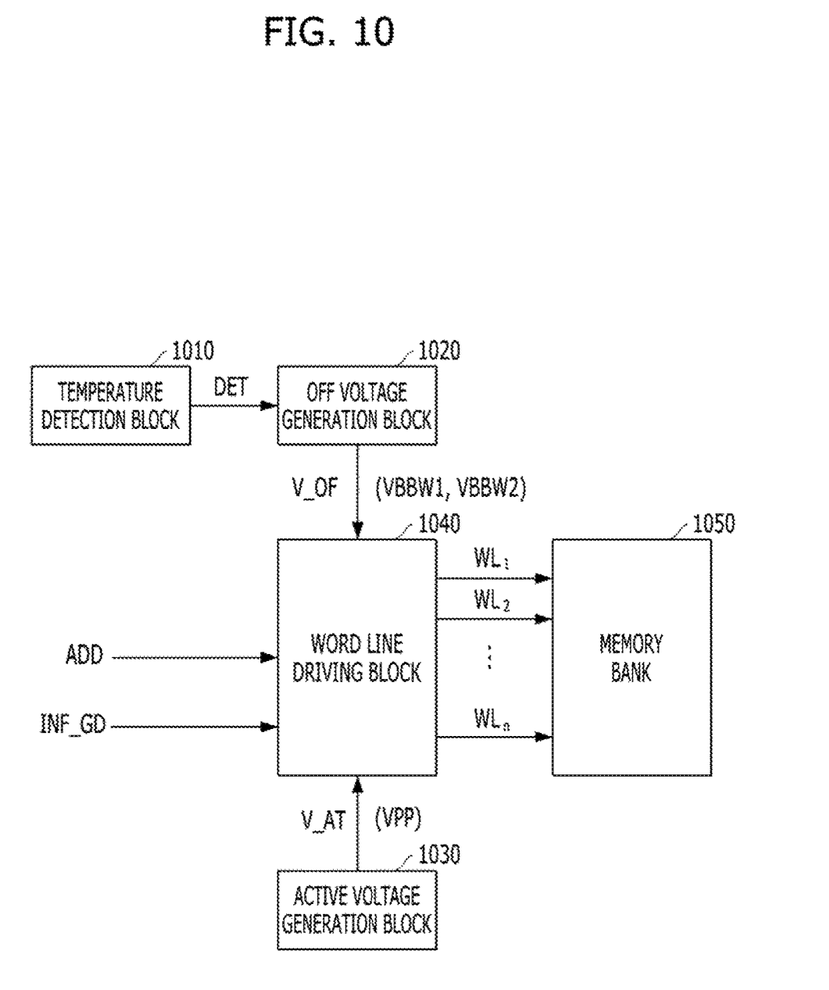
FIG. 10 is a block diagram illustrating a semiconductor memory device according to an embodiment of the present invention.

FIG. 10 is a block diagram illustrating a semiconductor memory device according to an embodiment of the present invention.

Referring to FIG. 10, the semiconductor memory device may include a temperature detection block 1010, an off voltage generation block 1020, an active voltage generation block 1030, a word line driving block 1040, and a memory bank 1050. In FIG. 10, it is added that state information INF_GD is inputted to the word line driving block 1040, as compared with the embodiment of FIG. 1. Thus, a description focusing thereon will be provided below.

The word line driving block 1040 may decode an address signal ADD and drive a plurality of word lines WL1, WL2, . . . , and WLn. An active operation may be performed on a word line corresponding to the address signal ADD among the word lines WL1, WL2, . . . , and WLn, and a deactivation operation may be performed on the other word lines. The word line driving block 1040 may receive an off voltage (i.e., a word line deactivation voltage or a precharge voltage) V_OF from the off voltage generation block 1020 and an active voltage V_AT from the active voltage generation block 1030. The word line driving block 1040 may drive the word line to be activated with the active voltage V_AT and the word lines to be deactivated with the off voltage V_OF.

The word line driving block 1040 may drive a word line corresponding to the state information INF_GD among the word lines WL1, WL2, . . . , and WLn with an off voltage having a predetermined voltage level. The state information INF_GD may correspond to an operation state or a process state of a memory cell arranged in the memory bank 1050. A detailed description on the word line driving block 1040 will be provided below with reference to FIG. 11.

According to the embodiment of the present invention, the semiconductor memory device may control the off voltage based on temperatures, and particularly, when the operation state or the process state of the memory cell is good, the word lines to be deactivated may be driven with a predetermined voltage level.

Figure 11:
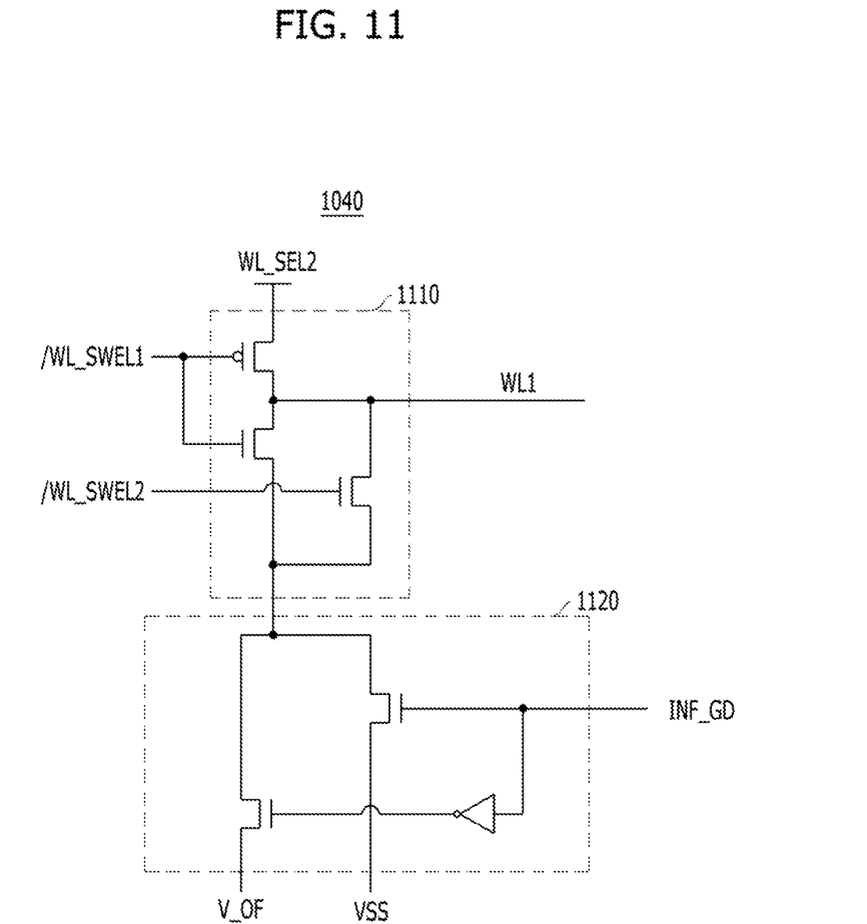
FIG. 11 is a circuit diagram of a word line driving block as shown in FIG. 10, according to an embodiment of the present invention.

FIG. 11 is a detailed diagram of the word line driving block 1040 shown in FIG. 10. For the sake of convenience in description, the structure corresponding to the first word line WL1 among the word lines WL1, WL2, . . . , and WLn is representatively described below.

Referring to FIG. 11, the word line driving block 1040 may include a driving unit 1110 and an off voltage set unit 1120.

The driving unit 1110 may drive the first word line WL1 in response to first and second word line selection signals /WL_SEL1 and /WL_SEL2. A signal "WL_SEL2" is an inverted signal of the second word line selection signal /WL_SEL2. For example, the signal "WL_SEL2" may have a voltage level corresponding to a pumping voltage VPP.

The off voltage set unit 1120 may supply the off voltage V_OF or a ground voltage VSS to the driving unit 1110 in response to the state information INF_GD. The state information INF_GD may correspond to the operation state or the process state of the memory cell coupled to the first word line WL1. The state information INF_GD may be stored in fuses or other storing circuits through a test operation or a state measurement operation of memory cells.

Hereinafter, a simple circuit operation is described.

When the operation state or the process state of the memory cell coupled to the first word line WL1 is good, the state information INF_GD may have a high logic level, and the ground voltage VSS may be supplied to the driving unit 1110. Hereinafter, the voltage supplied to the driving unit 1110 is referred to as a final off voltage. In other words, although the off voltage generation block 1020 generates a first back bias voltage VBBW1 or a second back bias voltage VBBW2 as the off voltage V_OF, the final off voltage may be the ground voltage VSS.

When the operation state or the process state of the memory cell coupled to the first word line WL1 is bad, the state information INF_GD may have a low logic level, and the off voltage V_OF may be supplied as the final off voltage.

According to an embodiments of the present invention, the semiconductor memory device may directly control the final off voltage supplied from the driving unit 1110 based on the state information of the memory cell.

As described above, according to the embodiments of the present invention, as a voltage level of an off voltage (i.e., a word line deactivation voltage or a precharge voltage) is controlled based on temperature, a leakage current occurring in a memory cell may be reduced. Consequently, the semiconductor memory device may have an improved refresh characteristic.

While the present invention has been described with respect to specific embodiments, the embodiments are not intended to be restrictive, but rather descriptive. Further, it is noted that the present invention may be achieved in various ways through substitution, change, and modification by those skilled in the art without departing from the scope of the present invention as defined by the following claims.

Also, dispositions and types of the logic gates and transistors described in the aforementioned embodiments may be implemented differently based on the polarity of the inputted signal.

What is claimed is:

1. A semiconductor memory device, comprising:
   a plurality of memory cells coupled to multiple word lines;
   an off voltage generation block suitable for generating word line deactivation voltages having different voltage levels corresponding to a plurality of temperatures;
   a word line driving block suitable for driving a word line to be deactivated with a word line deactivation voltage selected from the word line deactivation voltages; and
   a temperature detection block suitable for generating a plurality of detection signals corresponding to the plurality of temperatures and supplying the detection signals to the off voltage generation block,
   wherein the off voltage generation block includes:
      a plurality of voltage generation units suitable for generating a plurality of internal voltages; and
      a multiplexing unit suitable for outputting one of the internal voltages as the word line deactivation voltage in response to the detection signal.

2. The semiconductor memory device of claim 1, wherein the word line deactivation voltages correspond to the plurality of the detection signals.

3. The semiconductor memory device of claim 1, further comprising:
   an active voltage generation block suitable for generating an active voltage for activating a word line and supplying the active voltage to the word line driving block.

4. The semiconductor memory device of claim 1, wherein the voltage level of the word line deactivation voltage gets lower as a temperature gets higher.

5. The semiconductor memory device of claim 1, wherein the word line driving block includes:
   a driving unit suitable for driving a selected word line; and
   a voltage set unit suitable for supplying the word line deactivation voltage or a predetermined voltage to the driving unit in response to state information of a memory cell coupled to the corresponding word line.

6. A semiconductor memory device, comprising:
   a plurality of memory cells coupled to multiple word lines;
   a plurality of temperature detection blocks corresponding to temperature ranges that are set based on state information of the memory cells;
   a plurality of off voltage generation blocks suitable for generating word line deactivation voltages having different voltage levels corresponding to output signals of the temperature detection blocks; and
   a plurality of word line driving blocks suitable for driving a word line to be deactivated with the word line deactivation voltage selected from the word line deactivation voltages,
   wherein the word line deactivation voltage has a first voltage level when a operation state or a process state of the memory cells is good, and the word line deactivation voltage has a second voltage level which is lower than the first voltage level when the operation state or the process state of the memory cells is bad.

7. The semiconductor memory device of claim 6, further comprising:
   an active voltage generation block suitable for generating an active voltage for activating the word lines and supplying the active voltage to the word line driving blocks.

8. The semiconductor memory device of claim 6, wherein the voltage level of the word line deactivation voltage gets lower as a temperature gets higher.

9. The semiconductor memory device of claim 6, wherein some of the word lines have the word line deactivation voltage having the first voltage level, and the other word lines have the word line deactivation voltage having the second voltage level.

10. A semiconductor memory device, comprising:
    a plurality of memory cells coupled to multiple word lines;
    an off voltage generation block suitable for generating word line deactivation voltages having different voltage levels corresponding to a plurality of temperatures;
    a word line driving block suitable for driving a word line to be deactivated with a word line deactivation voltage selected from the word line deactivation voltages; and
    a temperature detection block suitable for generating a plurality of detection signals corresponding to the plurality of temperatures and supplying the detection signals to the off voltage generation block,
    wherein the off voltage generation block further includes:

a voltage generation unit suitable for generating the word line deactivation voltages; and a trimming unit suitable for controlling the word line deactivation voltages to the predetermined voltage during a training operation.

11. The semiconductor memory device of claim 10, further comprising:

a training control block suitable for controlling the trimming unit during the training operation, and controlling the trimming unit in response to the detection signal during a normal operation.

12. The semiconductor memory device of claim 11, wherein the training control block includes:

a first control signal generation unit suitable for generating a control signal for controlling the voltage level of the word line deactivation voltage during the training operation;

a second control signal generation unit suitable for generating a control signal for controlling the voltage level of the word line deactivation voltage to have a voltage level corresponding to the detection signal during the normal operation; and a multiplexing unit suitable for outputting one of the first and second control signal generation units through the training operation and the normal operation.

13. The semiconductor memory device of claim 12, wherein the second control signal generation unit receives information corresponding to the control signal of the first control signal generation unit after the training operation is completed.

14. The semiconductor memory device of claim 10, wherein the word line driving block includes:

a driving unit suitable for driving a selected word line; and a voltage set unit suitable for supplying the word line deactivation voltage or a predetermined voltage to the driving unit in response to state information of a memory cell coupled to the corresponding word line.

* * * * *